(12) United States Patent
Vogelsang

(10) Patent No.: US 8,717,797 B2
(45) Date of Patent: May 6, 2014

(54) SEMICONDUCTOR MEMORY DEVICE WITH HIERARCHICAL BITLINES

(75) Inventor: Thomas Vogelsang, Mountain View, CA (US)

(73) Assignee: Rambus Inc., Sunnyvale, CA (US)

(*) Notice: Subject to any disclaimer, the term of this patent is extended or adjusted under 35 U.S.C. 154(b) by 22 days.

(21) Appl. No.: 13/393,216

(22) PCT Filed: Jul. 30, 2010

(86) PCT No.: PCT/US2010/044037
§ 371 (c)(1),
(2), (4) Date: Feb. 28, 2012

(87) PCT Pub. No.: WO2011/028343
PCT Pub. Date: Mar. 10, 2011

(65) Prior Publication Data
US 2012/0170356 A1    Jul. 5, 2012

Related U.S. Application Data

(60) Provisional application No. 61/238,988, filed on Sep. 1, 2009.

(51) Int. Cl.
  *G11C 5/06*  (2006.01)
  *G11C 11/24*  (2006.01)
  *G11C 8/00*  (2006.01)

(52) U.S. Cl.
  USPC .................. 365/63; 365/149; 365/230.03

(58) Field of Classification Search
  USPC ............................................. 365/63
  See application file for complete search history.

(56) References Cited

U.S. PATENT DOCUMENTS

| | | | | |
|---|---|---|---|---|
| 5,886,943 A | * | 3/1999 | Sekiguchi et al. | 365/230.03 |
| 5,917,745 A | * | 6/1999 | Fujii | 365/63 |
| 5,966,340 A | * | 10/1999 | Fujino et al. | 365/230.03 |
| 6,125,070 A | * | 9/2000 | Tomishima | 365/230.03 |
| 7,269,048 B2 | | 9/2007 | Takashima | |
| 7,379,319 B2 | | 5/2008 | Takashima | |
| 7,486,563 B2 | | 2/2009 | Waller | 365/185.21 |
| 7,532,499 B2 | | 5/2009 | Takashima | |
| 7,589,367 B2 | | 9/2009 | Oh et al. | |

(Continued)

FOREIGN PATENT DOCUMENTS

| | | |
|---|---|---|
| JP | 2000-049301 A | 2/2000 |
| JP | 2005-209324 A | 8/2005 |

(Continued)

OTHER PUBLICATIONS

PCT International Search Report and Written Opinion, PCT/US2010/044037, Feb. 28, 2011, 8 Pages.

*Primary Examiner* — Son Mai
(74) *Attorney, Agent, or Firm* — Fenwick & West LLP

(57) ABSTRACT

A dynamic random access memory (DRAM) device has a hierarchical bitline structure with local bitlines and global bitlines formed on different metal layers. The local bitlines are separated into a plurality of local bitline sections, and bitline isolation switches are configured to connect or disconnect the local bitline sections to or from the global bitlines. As a result, the local bitlines with higher per-length capacitance can be made shorter, since the global bitline with lower per-length capacitance is used to route the signal from the cell capacitances of the memory cells to the remote sense amplifiers.

15 Claims, 5 Drawing Sheets

(56) References Cited

U.S. PATENT DOCUMENTS

| | | | |
|---|---|---|---|
| 8,331,162 B2* | 12/2012 | Kim et al. | 365/189.05 |
| 8,467,217 B2* | 6/2013 | Takayama et al. | 365/63 |
| 2005/0063214 A1 | 3/2005 | Takashima | |
| 2005/0122764 A1 | 6/2005 | Takashima | |
| 2006/0226459 A1 | 10/2006 | Oh et al. | |
| 2007/0242539 A1* | 10/2007 | Ilda | 365/203 |
| 2008/0007987 A1 | 1/2008 | Takashima | |
| 2008/0205117 A1 | 8/2008 | Takashima | |
| 2008/0308941 A1 | 12/2008 | Matick et al. | |
| 2009/0059644 A1 | 3/2009 | Kajigaya | 365/72 |
| 2009/0191677 A1 | 7/2009 | Forbes | |
| 2009/0291522 A1 | 11/2009 | Oh et al. | |
| 2010/0085813 A1 | 4/2010 | Shino | |
| 2012/0314468 A1* | 12/2012 | Siau et al. | 365/66 |

FOREIGN PATENT DOCUMENTS

| | | |
|---|---|---|
| JP | 2009-032384 A | 2/2009 |
| KR | 10-0621774 B1 | 9/2006 |
| WO | WO 2009/005075 A2 | 1/2009 |

* cited by examiner

SEMICONDUCTOR MEMORY DEVICE WITH HIERARCHICAL BITLINES

BACKGROUND

The present disclosure relates to dynamic random access memory (DRAM) devices with hierarchical bitlines.

As the feature size of DRAMs shrinks further, the bitlines for addressing the DRAM memory cells are also becoming shorter in order to maintain a low ratio of bitline parasitic capacitance to cell capacitance of the DRAM memory cell. Thus, it has become a technical challenge to route the shorter bitlines to the sense amplifiers that are used to detect the data stored in the cell capacitances of the DRAM memory cells.

DETAILED DESCRIPTION OF EMBODIMENTS

Embodiments of the present disclosure provide a dynamic random access memory (DRAM) device having a hierarchical bitline structure with local bitlines and global bitlines formed on different metal layers. The local bitlines are separated into a plurality of local bitline sections, and bitline isolation switches are formed configured to connect or disconnect the local bitline sections to or from the associated global bitlines. More specifically, in one embodiment, the DRAM comprises a plurality of wordlines, a plurality of local bitlines where each local bitline includes a plurality of local bitline sections, a plurality of memory cells at intersections of the wordlines and the local bitlines with each memory cell including a cell access transistor and cell capacitance and each local bitline section coupled to the cell access transistors of a predetermined number of the memory cells, a plurality of global bitlines with each global bitline associated with one of the local bitlines, and a plurality of bitline isolation switches with each bitline isolation switch associated with one of the local bitline sections and configured to connect the associated local bitline section to one of the global bitlines. With the DRAM according to the embodiments herein, the local bitlines with higher per-length capacitance can be made shorter, since the global bitline with lower per-length capacitance is used to route the signal from the cell capacitances of the memory cells to the remote sense amplifiers of the DRAM device.

Reference will now be made to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles of the disclosure described herein.

Figure 1:
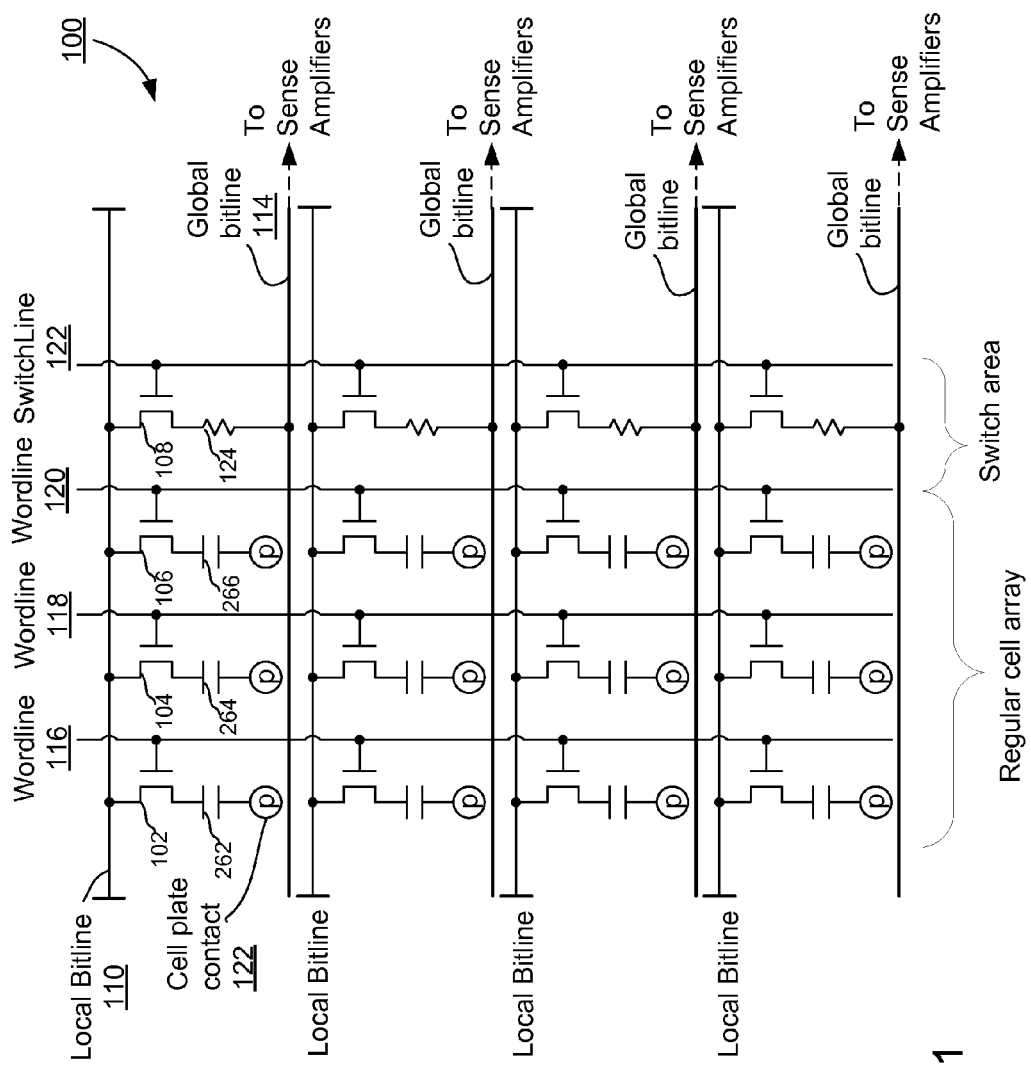
FIG. 1 illustrates the structure of a DRAM memory cell array, according to one embodiment.

FIG. 1 illustrates the structure of the DRAM memory cell array according to one embodiment. The DRAM 100 includes a plurality of memory cells arranged at the intersections of the local bitlines (e.g., local bitline 110) and the wordlines 116, 118, 120. For example, cell access transistor 102 and cell capacitance 262 form one memory cell, cell access transistor 104 and cell capacitance 264 form another memory cell, cell access transistor 106 and cell capacitance 266 form still another memory cell, all of which are connected to local bitline 110. The cell capacitances 262, 264, 266 are coupled to the cell access transistors 102, 104, 106 on one end and the plate contacts (e.g., plate contact 122) on the other end.

The DRAM according to the embodiment of FIG. 1 employs a hierarchical bitline structure. That is, each local bitline 110 is accompanied by a corresponding global bitline 114 placed substantially in parallel with the local bitline 110. As will be illustrated in more detail in FIG. 2, the local bitlines 110 are fabricated on a metal layer different from the metal layer on which the global bitlines 114 are formed. The local bitlines 110 are also loaded by the junction capacitance of the cell access transistors 102, 104, 106 and the parasitic capacitance between the global bitline 114 and cell plate contacts 122, and thus have larger per-length capacitance (e.g., 80 fF/100 μm=0.8 pF/mm) than the typical per-length capacitance (0.3 pF/mm) of the global bitlines 114 which have only the capacitance to the neighbor wires of the other global bitlines and the metal levels above and below the metal layer on which the global bitlines 114 are formed.

As will be explained in more detail below with reference to FIG. 2, the local bitlines 110 are broken into a plurality of sections, and each bitline section 110 is coupled to only a certain number of memory cells. In the embodiment of FIG. 1, the bitline section 110 is connected to three memory cells via the cell access transistors 102, 104, 106. Other memory cells are connected to other sections (not shown in FIG. 1) of the local bitlines. Further, bitline isolation switches 108 are added to connect or disconnect the local bitline section 110 to or from the global bitline 114 as necessary. There is one bitline isolation switch 108 for each pair of local bitline section 110 and global bitline 114, and thus the bitline isolation switches are formed on-pitch, i.e., as densely packed on the DRAM memory cell array as the local bitlines 110 themselves. When bitline isolation switch 108 is turned on, the local bitline section 110 is connected to the global bitline 114. However, when bitline isolation switch 108 is turned off, the local bitline section 110 and the global bitline 114 are electrically disconnected from each other.

At least one bitline isolation switch 108 is connected between every bitline section of the local bitline 110 and the global bitline 114, and is responsible for connecting the associated local bitline section 110 with the global bitline 114. Note that, unlike the local bitlines 110, global bitline 114 is not broken into a plurality of sections. That is, a single global bitline 114 is used in parallel with all the memory cells coupled to the plurality of sections 110 of local bitline. Of course, multiple global bitlines are present that correspond to different local bitlines on different columns addresses of the DRAM 100.

Each cell access transistor 102, 104, 106 may be turned on by asserting a logic high voltage on the associated wordlines 116, 118, 120. Selection of the wordlines 116, 118, 120 is based on the row address of the DRAM 100. Similarly, the bitline isolation switch 108 may be turned on by asserting a logic high voltage on the associated switchline 122. Control circuitry (not shown herein) on DRAM 100 determines which switchline 122 to activate in order to connect the local bitline section 110 to the global bitline 114 based on which section 110 of the local bitline is being currently driven to read data therefrom, which is evident from the row address corresponding to the wordline 116, 118, 120 that is being driven. Only the bitline isolation switch(es) 108 that are connected to the local bitline section 110 that includes the memory cell currently being driven is turned on to connect that local bitline section 110 to the global bitline 114. Other bitline isolation switches corresponding to other local bitline sections are turned off.

Sense amplifiers for detecting the data stored in the cell capacitances 102, 104, 106 are coupled to the global bitlines 114 rather than the local bitline sections 110. Data read from the DRAM memory cells (e.g., memory cell comprised of transistor 102 and capacitor 262) is passed on from the memory cell to the corresponding section of the local bitline 110 in which the memory cell is placed, and then to the global bitline 114 via the bitline isolation switch 108 and resistive via conductor 124. In this manner, the local bitlines 110 with higher per-length capacitance may be made shorter, since the global bitline 114 with lower per-length capacitance is used to route the signal from the cell capacitances 102, 104, 106 to the remote sense amplifiers. Also, the sense amplifiers that typically take up large space on the DRAM devices may be placed farther away from the memory cells without adversely affecting the integrity of the signal read from the DRAM because, because the global bitlines 114 that form the majority of the length of the routing have low per-length capacitance. As a result, there is no need to place a larger number of sense amplifiers near the local bitlines 110.

Figure 2:
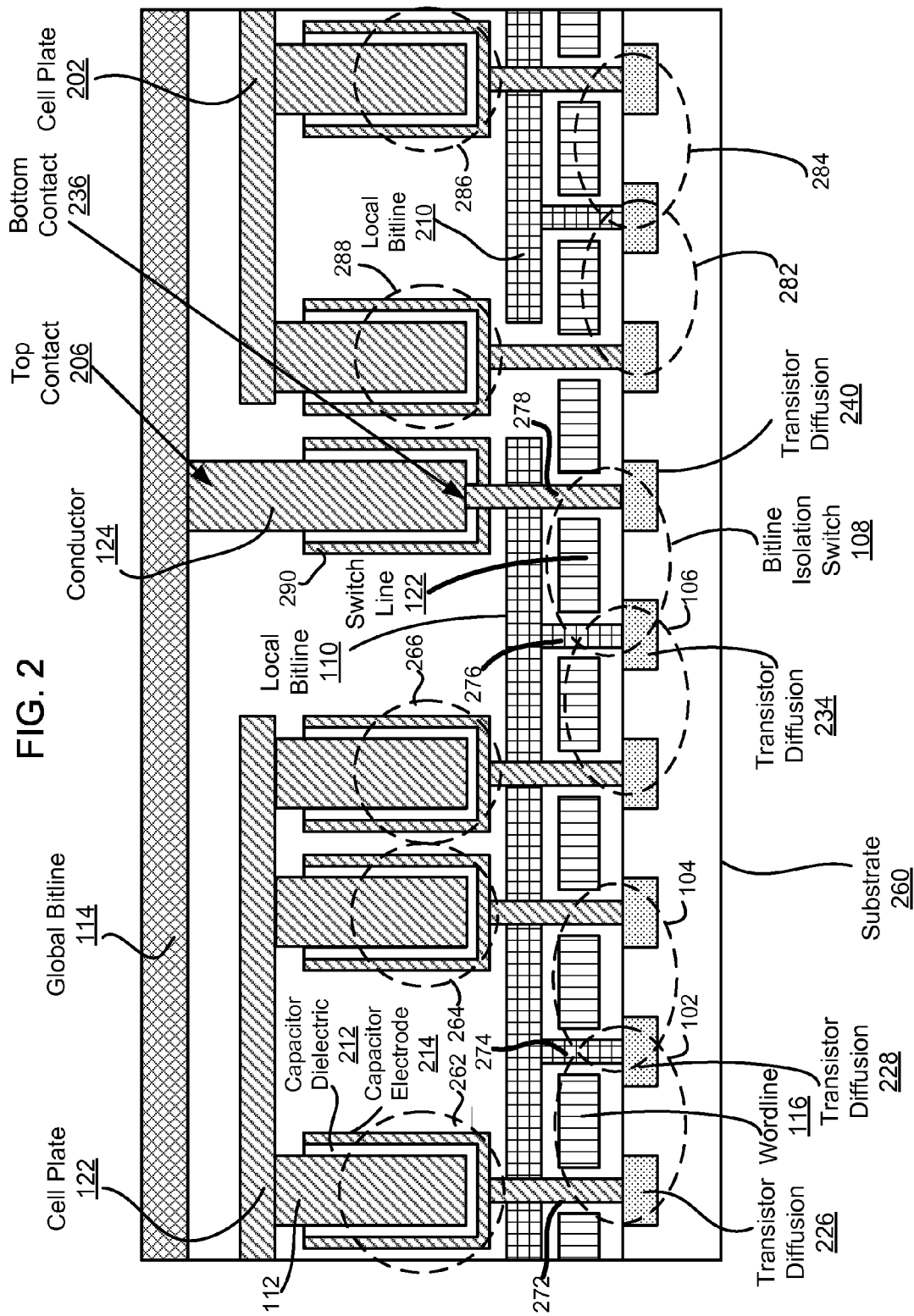
FIG. 2 is a cross sectional view of the DRAM memory cells, according to one embodiment.

FIG. 2 is a cross sectional view of the DRAM memory cells according to one embodiment. The cross sectional view of FIG. 2 corresponds to the structure of the DRAM memory cells along one of the bitlines. Note that the features of FIG. 2 that are shown without hashing correspond to insulating material such as silicon dioxide, except for substrate 260.

The DRAM includes a plurality of memory cells arranged at the intersections of the bitlines and the wordlines. For example, cell access transistor 102 and cell capacitance 262 form one memory cell, cell access transistor 104 and cell capacitance 264 form another memory cell, cell access transistor 106 and cell capacitance 266 form still another memory cell, all of which are connected to local bitline section 110. The cell capacitances 262, 264, 266 are coupled to the cell access transistors 102, 104, 106 on one end and the cell plate 122 on the other end. For example, cell capacitance 262 is comprised of the cell plate electrode 112, capacitor dielectric 212, and capacitor electrode 214, and is connected to cell access transistor 102 via the capacitor contact 272. For another example, cell access transistor 102 is comprised of the transistor diffusion areas 226, 228 formed in the substrate 260, and is turned on or off according to the voltage applied to wordline 116 that functions as the gate electrode for cell access transistor 102. Cell access transistors 102, 104, 106 are connected to local bitline section 110 via bitline contacts (e.g. bitline contact 274). Local bitline section 110 is also coupled to bitline isolation switch 108 via bitline contact 276.

Bitline isolation switch 108 is fabricated using the same type of transistor diffusions 234, 240 as those that form the cell access transistors 102, 104, 106. Bitline isolation switch 108 connects or disconnects the local bitline section 110 (and the cell access transistors 102, 104, 106 connected to local bitline section 110) to or from global bitline 114 depending upon whether it is turned on or off, through the via conductor 124. Bitline isolation switch 108 may be turned on by asserting a logic high voltage on the associated switchline 122. The via conductor 124 can be fabricated at the typical capacitor opening that would be present in a DRAM cell but by replacing the capacitance dielectric with conductive material. The via conductor 124 may be fabricated at a metal level that is available anyway during fabrication of the DRAM device or by adding another metal level during the fabrication process. Thus, the combination of the bitline isolation switch 108 and the via conductor 124 does not take any more space on the substrate 260 than the space that would be taken up by a typical DRAM memory cell comprised of a cell access transistor and cell capacitance and does not add to the cost of the DRAM fabrication process in a significant manner.

Although the embodiment of FIG. 2 illustrates the example of three memory cells coupled to one local bitline section 110 and a bitline isolation switch 108 and two local bitline sections 110, 210 corresponding to one global bitline 114, this is merely for simplicity of illustration. In actual DRAM applications, a different number of memory cells may be coupled to one local bitline section and a bitline isolation switch, and a different number of local bitline sections may correspond to one global bitline. For example, in a real DRAM application, a global bitline length corresponding to 256 or 512 bits may correspond to three to five local bitline sections, and approximately 50-180 memory cells may be connected to each one of these local bitline sections. Having fewer than three (e.g., one or two) local bitline sections per global bitline may result in a higher than desired bitline capacitance, as the length of each local bitline section becomes too close to the length of the corresponding global bitline, On the other hand, having too many local bitline sections (e.g., 10, 11, 12, or 13) per global bitline may also result in higher than desired bitline capacitance due to the length overhead necessitated by the additional bitline isolation switches needed for connecting these many local bitline sections with the corresponding global bitline.

On the other side of the DRAM structure, another local bitline section 210 is formed electrically separated (disconnected) from local bitline section 110. Local bitline section 210 is coupled to a memory cell that is comprised of cell access transistor 282 and cell capacitance 288, and to another memory cell that is comprised of cell access transistor 284 and cell capacitance 286 and to still other memory cells (not shown). Another bitline isolation switch (not shown in FIG. 2) connects the local bitline section 210 (and the cell access transistors 282, 284 connected to local bitline section 210) to global bitline 114.

As shown in FIG. 2, the local bitline sections 110, 210 are fabricated on a metal layer different from the metal layer on which the global bitlines 114 are formed. The local bitlines 110, 210 have larger per-length capacitance (e.g., 80 fF/100 µm=0.8 pF/mm) than the typical per-length capacitance (0.3 pF/mm) of the global bitlines 114.

Control circuitry (not shown herein) on the DRAM determines which memory cell and bitline isolation switch to drive for a read or write operation. For example, when data from the memory cell comprised of capacitance 262 and cell access transistor 102 is to be read, DRAM controller drives wordline 116 to a logic high voltage. Also, based on the row number corresponding to wordline 116, DRAM controller determines that switchline 122 that corresponds to local bitline section 110 to which cell access transistor 102 is connected should be turned on, and thus drives switchline 122 to a logic high voltage as well. As a result, cell access transistor 102 and bitline isolation switch 108 are turned on. Charges stored in cell capacitance 262 is read, and passed through a path including capacitance contact 272, transistor diffusion 226, transistor diffusion 228, bitline contact 274, local bitline section 110, bitline contact 276, transistor diffusion 234, transistor diffusion 240, via contact 278, bottom contact 236, via conductor 124, top contact 206, and to the global bitline 114. As explained above, sense amplifiers (not shown in FIG. 2) are coupled to the global bitlines 114 and detect the data read from cell capacitance 262.

Write operation to the DRAM cells is performed in a similar manner. For example, when data is to be written to the memory cell comprised of capacitance 262 and cell access transistor 102, control circuitry (not shown) on the DRAM drives the wordline 116 to a logic high voltage. Also, based on the row number corresponding to wordline 116, DRAM controller determines that switchline 122 that corresponds to local bitline section 110 to which cell access transistor 102 is connected should be turned on, and thus drives switchline 122 to logic high voltage as well. As a result, cell access transistor 102 and bitline isolation switch 108 are turned on. The write data is driven from the memory controller to global bitline 114, top contact 206, via conductor 124, bottom contact 236, via contact 278, transistor diffusion 240, transistor diffusion 234, bitline contact 276, local bitline section 110, bitline contact 274, transistor diffusion 228, transistor diffusion 226, and capacitance contact 272 to be stored as charges in capacitance 262.

As shown in FIG. 2, the local bitline sections 110, 210 with higher per-length capacitance are made shorter, while the global bitline 114 with lower per-length capacitance is made longer and used to route the signal from the cell capacitances 262, 264, 266 to the remote sense amplifiers (not shown in FIG. 2). Also, the sense amplifiers that typically take up large space on the DRAM devices are fabricated at the global bitline level, farther away from the memory cells without adversely affecting the integrity of the signal read from the DRAM, because the global bitlines 114 that form the majority of the length of routing has lower per-length capacitance. As a result, there is no need to place a larger number of sense amplifiers near the local bitline sections 110, 210. The DRAM according to the embodiments herein can be fabricated with fewer sense amplifiers and reduced cost due to the increased effective bitline length or with reduced bitline capacitance and enhanced performance at the same bitline length. Although an additional metal layer and a process step to form the via conductor 124 may be needed, the benefits far surpass the additional costs incurred to form the via conductor 124.

Figure 3A:
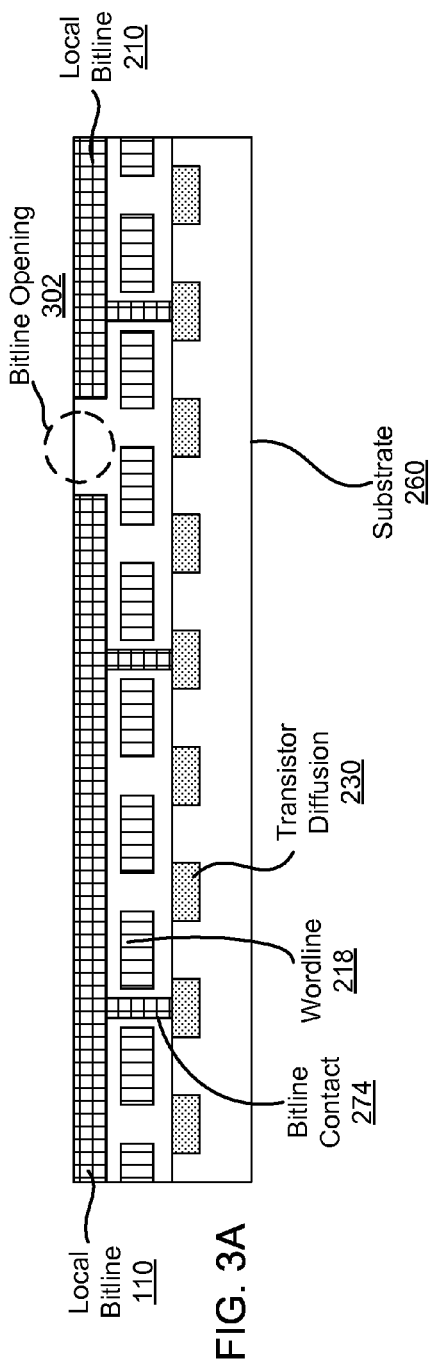
FIGS. 3A, 3B, 3C, 3D, and 3E illustrate a process for fabricating the DRAM memory cells, according to one embodiment.

FIGS. 3A, 3B, 3C, 3D, and 3E illustrate a process for fabricating the DRAM memory cells, according to one embodiment. Referring to FIG. 3A, the cell access transistors and gate isolation switch gates and diffusions (e.g., wordline 218 and transistor diffusion 230) are formed in and above the substrate 260 using the usual process of implanting the channel doping, building and patterning the gate stack, and implanting the diffusions. For example, the substrate 260 may be p-type silicon and the transistor diffusions 230 may be n+ type diffusion. Also, the local bitline sections 110, 210 are formed by standard metallization processes and patterned. Also, a bitline opening 302 is created to separate the local bitline sections 110, 210 on one local bitline.

Figure 3B:
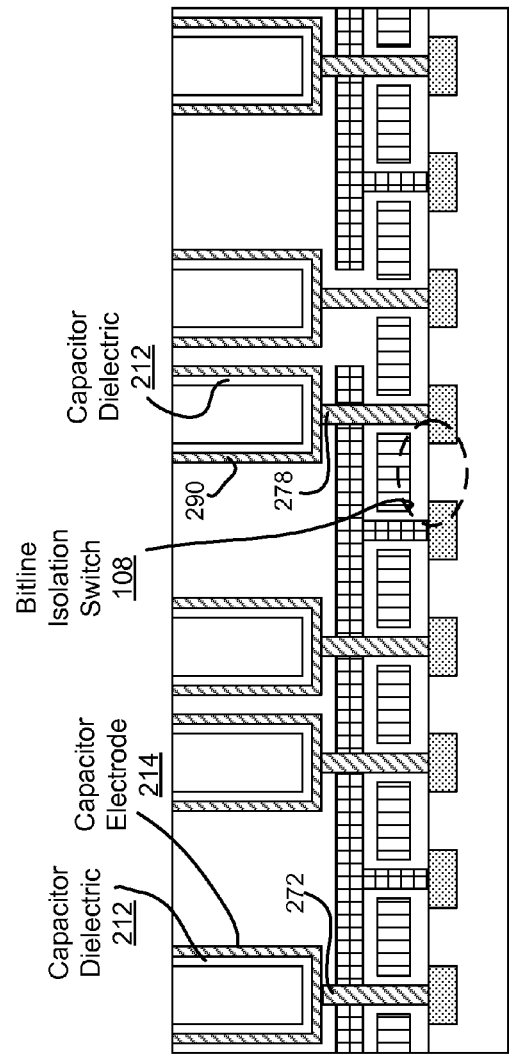

Then, referring to FIG. 3B, the capacitor contacts 272, the capacitor electrodes 214, and the capacitor dielectric 212 are formed to form the cell capacitance of the memory cells. Note that the capacitor contact 278 and the capacitor electrode 290 corresponding to bitline isolation switch 108 are also formed together in the same process with the other capacitor contacts 272 and the capacitor electrodes 214 corresponding to the cell capacitance of the memory cells.

Figure 3C:
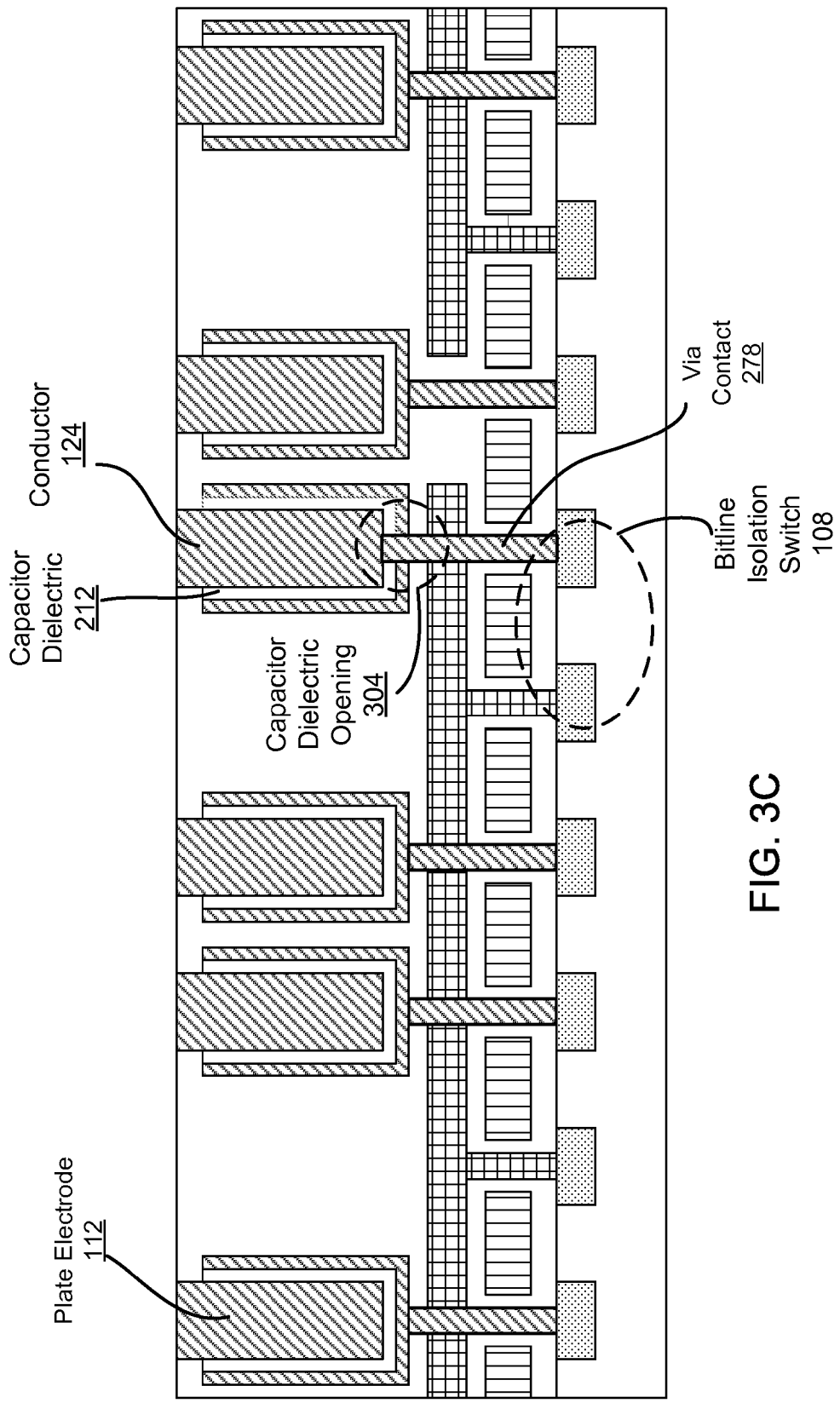

Referring to FIG. 3C, an opening 304 is formed in the capacitor dielectric 212 adjacent to the bitline isolation switch 108. Then, the plate electrode 112 is formed to complete the fabrication of the cell capacitance. Simultaneously with the plate electrode 112, the via conductor 124 also is formed during the same metallization process, filling the opening 304 also with the via conductor material 124. In this manner, the via contact 278 comes in contact with the via conductor 124.

Figure 3D:
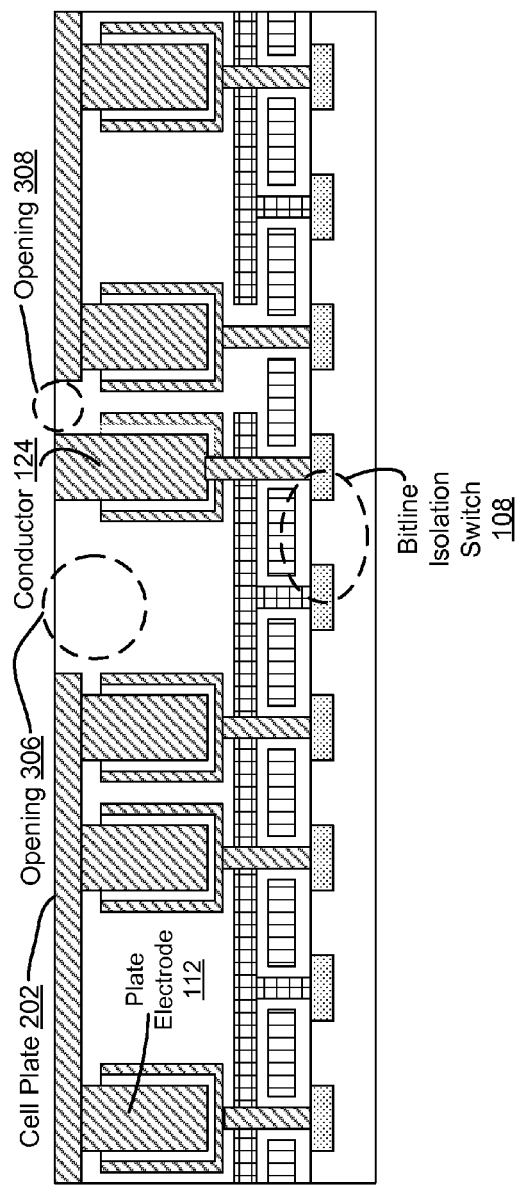

Referring to FIG. 3D, the cell plate 202 is formed on the plate electrodes 112 of the cell capacitance and the via conductor 124. The cell plate 202 is also patterned to create an opening 306, so that the cell plate 202 is separated at the bitline isolation switch 108.

Figure 3E:
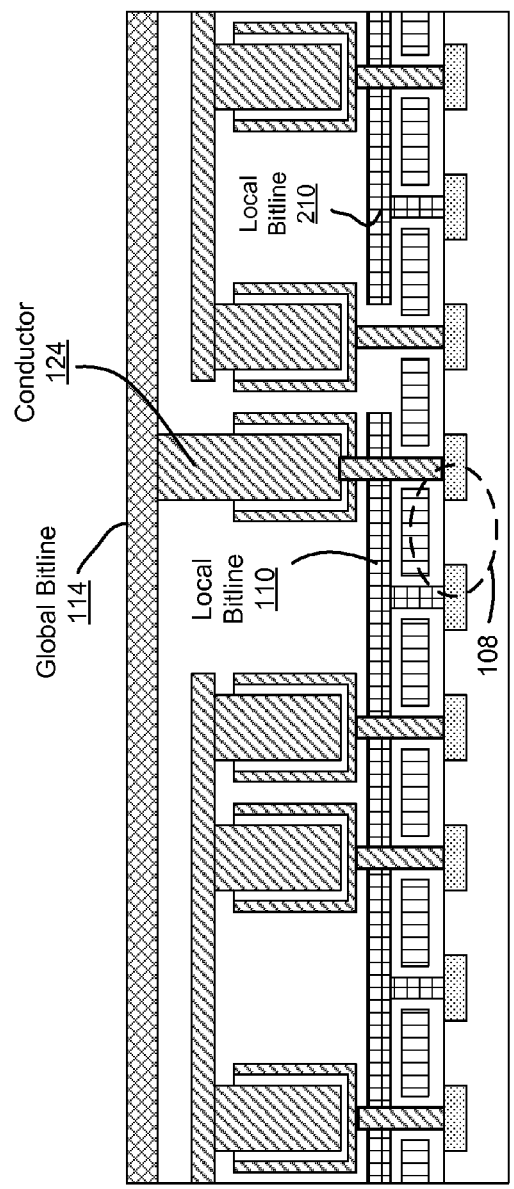

Finally, referring to FIG. 3E, global bitline 114 is formed to connect to via conductor 124, so that the local bitline sections 110, 210 can be connected to the global bitline through the bitline isolation switch 108 and the via conductor 124. Thus, according to the process explained with reference to FIGS. 3A through 3F, DRAM cells with hierarchical bitlines can be fabricated with local bitlines broken into sections that may be coupled to the global bitlines via the bitline isolation switch corresponding to each local bitline section.

Upon reading this disclosure, those of ordinary skill in the art will appreciate still additional alternative structural and functional designs for a DRAM with hierarchical bitlines, through the disclosed principles of the present disclosure. Thus, while particular embodiments and applications of the present disclosure have been illustrated and described, it is to be understood that the disclosure is not limited to the precise construction and components disclosed herein. Various modifications, changes and variations which will be apparent to those skilled in the art may be made in the arrangement, operation and details of the method and apparatus of the present disclosure disclosed herein without departing from the spirit and scope of the disclosure as defined in the appended claims.

What is claimed is:

1. A dynamic random access memory (DRAM) device, comprising:
    a plurality of wordlines;
    a plurality of local bitlines, each local bitline including a plurality of local bitline sections;
    a plurality of memory cells at intersections of the wordlines and the local bitlines, each memory cell including a cell access transistor and a cell capacitance, and each local bitline section coupled to the cell access transistors of a predetermined number of the memory cells;
    a plurality of global bitlines, each global bitline being associated with at least one of the local bitlines, wherein the global bitlines have lower per-length capacitance than the local bitlines; and
    a plurality of bitline isolation switches, each bitline isolation switch being associated with at least one of the local bitline sections and configured to connect the associated local bitline section to one of the global bitlines.

2. The DRAM device of claim 1, wherein the bitline isolation switches are connected between the associated one of the local bitline sections and said one of the global bitlines.

3. The DRAM device of claim 1, wherein the local bitline sections are electrically disconnected from each other.

4. The DRAM device of claim 1, wherein the local bitlines are formed on a first layer different from a second layer on which the global bitlines are formed.

5. A dynamic random access memory (DRAM) device, comprising:
    a plurality of wordlines;
    a plurality of local bitlines, each local bitline including a plurality of local bitline sections;
    a plurality of memory cells at intersections of the wordlines and the local bitlines, each memory cell including a cell access transistor and a cell capacitance, and each local bitline section coupled to the cell access transistors of a predetermined number of the memory cells;

a plurality of global bitlines, each global bitline being associated with at least one of the local bitlines; and a plurality of bitline isolation switches, each bitline isolation switch being associated with at least one of the local bitline sections and configured to connect the associated local bitline section to one of the global bitlines, wherein the bitline isolation switches have substantially same size and structure as the cell access transistor of the memory cells.

6. A dynamic random access memory (DRAM) device, comprising:

a plurality of wordlines;

a plurality of local bitlines, each local bitline including a plurality of local bitline sections;

a plurality of memory cells at intersections of the wordlines and the local bitlines, each memory cell including a cell access transistor and a cell capacitance, and each local bitline section coupled to the cell access transistors of a predetermined number of the memory cells;

a plurality of global bitlines, each global bitline being associated with at least one of the local bitlines;

a plurality of bitline isolation switches, each bitline isolation switch being associated with at least one of the local bitline sections and configured to connect the associated local bitline section to one of the global bitlines; and a plurality of via conductive elements, each via conductive element coupled between a corresponding bitline isolation switch and a corresponding global bitline, wherein the via conductive elements are formed at cell capacitance openings in place of cell capacitances.

7. The DRAM device of claim 1, wherein the bitline isolation switches are turned on or off according to a voltage applied to switchlines that are formed on pitch substantially in parallel with the wordlines.

8. The DRAM device of claim 5, wherein the bitline isolation switches are connected between the associated one of the local bitline sections and said one of the global bitlines.

9. The DRAM device of claim 5, wherein the local bitline sections are electrically disconnected from each other.

10. The DRAM device of claim 5, wherein the local bitlines are formed on a first layer different from a second layer on which the global bitlines are formed.

11. The DRAM device of claim 5, wherein the bitline isolation switches are turned on or off according to a voltage applied to switchlines that are formed on pitch substantially in parallel with the wordlines.

12. The DRAM device of claim 6, wherein the bitline isolation switches are connected between the associated one of the local bitline sections and said one of the global bitlines.

13. The DRAM device of claim 6, wherein the local bitline sections are electrically disconnected from each other.

14. The DRAM device of claim 6, wherein the local bitlines are formed on a first layer different from a second layer on which the global bitlines are formed.

15. The DRAM device of claim 6, wherein the bitline isolation switches are turned on or off according to a voltage applied to switchlines that are formed on pitch substantially in parallel with the wordlines.

* * * * *